United States Patent [19]

Heimbigner et al.

[11] 4,011,516
[45] Mar. 8, 1977

[54] FREQUENCY CORRECTION ARRANGEMENT

[75] Inventors: Gary L. Heimbigner, Anaheim; Robert G. Carlson, Costa Mesa, both of Calif.

[73] Assignee: Rockwell International Corporation, El Segundo, Calif.

[22] Filed: Nov. 3, 1975

[21] Appl. No.: 628,294

[52] U.S. Cl. .................. 328/14; 328/41; 328/48; 328/155; 328/158; 331/1 A

[51] Int. Cl.² .................................. H03B 19/00

[58] Field of Search .............. 328/39, 41, 42, 48, 328/158, 155, 14; 331/1 A, 25

[56] References Cited

UNITED STATES PATENTS

| | | | |
|---|---|---|---|
| 3,258,696 | 6/1966 | Heymann | 328/48 X |
| 3,424,986 | 1/1969 | Vasseur | 328/39 X |
| 3,614,632 | 10/1971 | Leibowitz et al. | 328/48 X |
| 3,657,658 | 4/1972 | Kubo | 328/48 X |
| 3,671,871 | 6/1972 | Malm | 328/14 X |
| 3,824,379 | 7/1974 | Tomisawa et al. | 328/48 X |
| 3,928,812 | 12/1975 | Bates | 331/25 X |

OTHER PUBLICATIONS

"Dynamic Rate Multiplier" *Handbook of Automation Computation and Control* vol. 2 pp. 29–09, 29–10 copyright 1959 by Grabbe, Ramo & Woolridge.

*Primary Examiner*—John S. Heyman
*Attorney, Agent, or Firm*—H. Fredrick Hamann; G. Donald Weber, Jr.; Morland Charles Fischer

[57] ABSTRACT

An electronically programmable frequency correction arrangement. The frequency of a source input signal is compared to a desired frequency. Pulse stuffing techniques are utilized by which a number of pulses comprising a frequency correction signal are selectively added to the input signal so as to accurately adjust the source frequency to the desired frequency.

13 Claims, 5 Drawing Figures

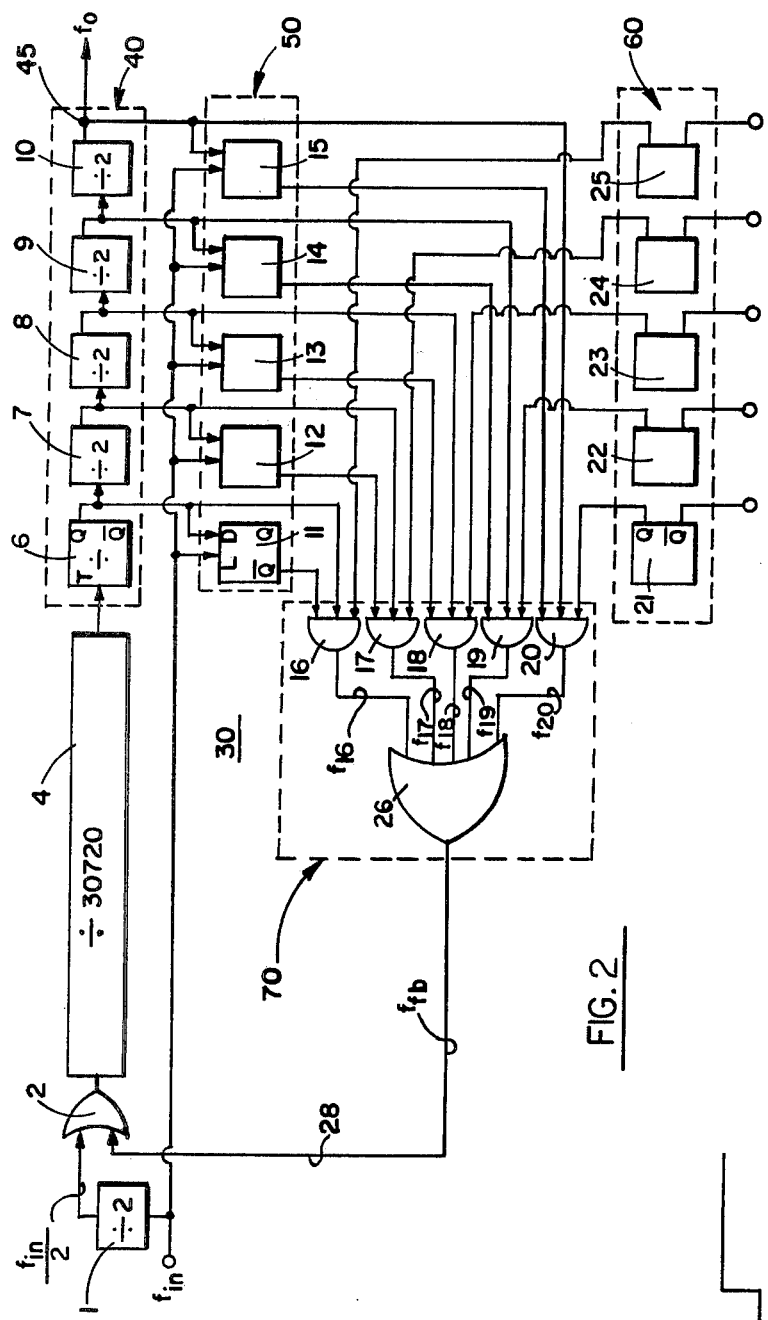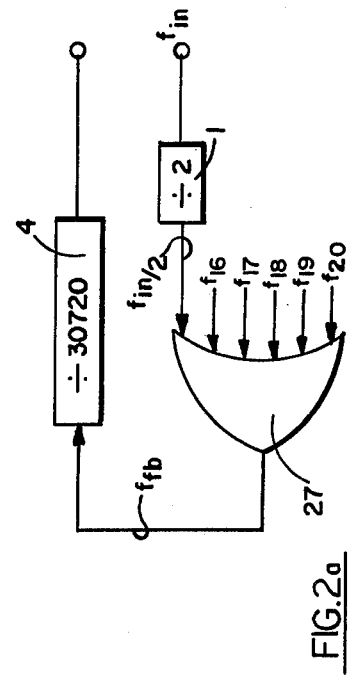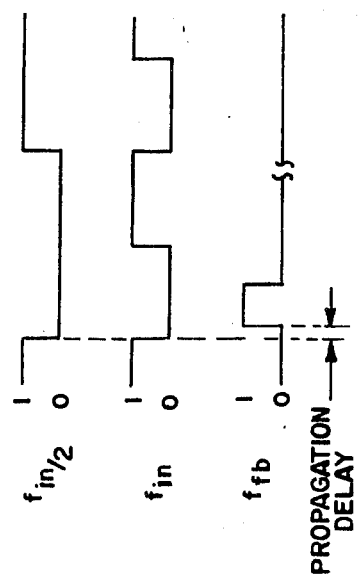

FREQUENCY CORRECTION ARRANGEMENT

BACKGROUND OF THE INVENTION

1. Field of the Invention

This invention relates to an electronically programmable frequency correction arrangement utilizing pulse stuffing techniques to selectively adjust the frequency of a source input signal to a desired frequency.

2. Prior Art

Conventional crystal oscillators are used to provide input signals of specific frequencies to drive components forming an electronic watch or the like. The crystals frequently need to be slightly tuned in order to accurately provide the required source frequency. One tuning technique includes mounting the crystal below a glass surface. Laser energy is projected through the glass to tune the crystal. However, this technique is relatively costly.

Another tuning technique includes the utilization of a small trimming capacitor. However, such as in the case of an electronic watch, for example, a trimming capacitor is undesirable because of the cost and size thereof.

Crystals are known which are more easily tuned, but many of these crystals lack stability (i.e. the frequency provided therefrom tends to drift with the aging of the crystal, shock, temperature change, etc.).

Conventional mechanical means for correcting the oscillator source frequency to a desired frequency include the utilization of switches, jumpers or bond wires. Arrangements of this type also consume relatively large amounts of space. Thus, in a utilization device where space is critical, such as, for example, in an electronic watch module, the conventional mechanical means for adjusting the oscillator source frequency are undesirable.

SUMMARY OF THE INVENTION

Briefly, and in general terms, a low-cost, highly stable frequency correction is provided in order to accurately adjust the frequency of an oscillator input signal to a desired frequency. Monitoring means are provided to test the frequency of the input signal and to determine how many correction pulses are needed to adjust the source frequency as desired. A memory stage, comprised, in a preferred embodiment, of storage flip-flops, is electrically programmed to selectively enable the desired number of correction pulses to be propagated through a pulse-forming stage. The correction pulses form a signal which is fed back and gated with the input signal. In a preferred embodiment of the invention, the number of correction pulses fed back and gated with the input signal is chosen in a binary weighted sequence by selectively forcing a corresponding number of the storage flip-flops into a suitable logic state in order to enable the logic comprising the pulse-forming stage.

BRIEF DESCRIPTION OF THE DRAWINGS

FIG. 1 illustrates the waveforms representative of an oscillator input signal, the equivalent of the oscillator input signal divided by a factor of 2, and the feedback correction signal of the instant invention;

FIGS. 2 and 2a show the programmable frequency correction arrangement of the instant invention;

DESCRIPTION OF THE PREFERRED EMBODIMENT

Figure 3:
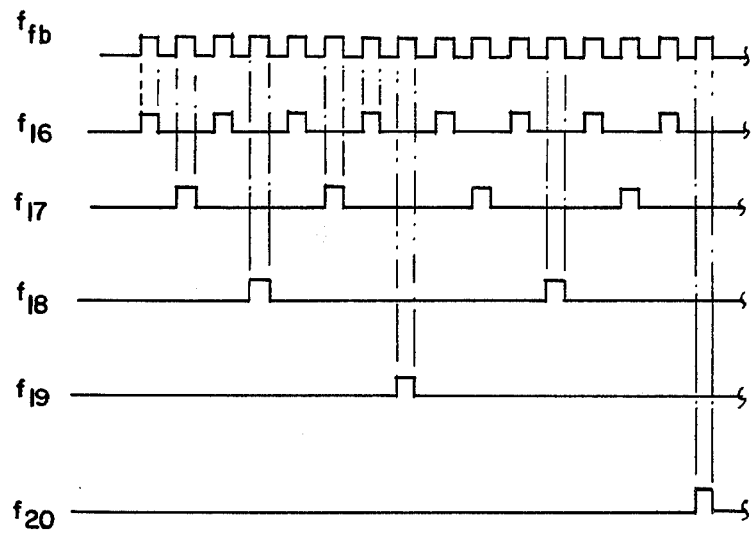
FIG. 3 illustrates the waveforms over one half a correction cycle representative of pulse trains which may be selectively added together to comprise the instant feedback correction signal.

Relating to FIG. 1, the waveforms illustrated are representative of an input oscillator signal, designated $f_{in}$, the equivalent of the input signal divided by a factor of 2, designated $f_{in/2}$, and a feedback correction signal, designated $f_{fb}$. The oscillator input signal may be supplied, for example, by an conventional crystal oscillator-amplifier signal source means and typically has a frequency of 32,768 Hz. Such an input signal $f_{in}$, as illustrated in FIG. 1 may be utilized to drive suitable components of an electronic watch assembly, or the like. The means for propagating the feedback signal $f_{fb}$ is, by virtue of the instant invention, electronically programmed to supply a correction pulse, as many times as is necessary, once out of every $n$ cycles of the input oscillator signal $f_{in}$. As will be explained in greater detail hereinafter, feedback correction signal $f_{fb}$ is comprised of a number of adjusting pulses which are selectively added together and to the oscillator input signal so as to accurately provide a resultant output signal ($f_o$) having a desired frequency. The propagation of the feedback correction signal $f_{fb}$ is momentarily delayed with respect to the propagation of the oscillator input signal $f_{in}$ by a large counter means so as to prevent pulses of the feedback correction signal $f_{fb}$ from overlapping the oscillator input signal $f_{in}$.

In a preferred embodiment of the invention, a low cost and highly stable feedback arrangement 30 is shown in FIG. 2 to provide an output signal $f_o$ having a frequency which may be accurately adjusted to a desired frequency. The instant arrangement employs a technique known as "pulse stuffing." In general terms, pulse stuffing refers to the periodic addition of pulses to a pulse train otherwise having a uniform rate of repetition. In the instant technique, the frequency of the oscillator input signal $f_{in}$ is initially set to be lower than the desired frequency. The correction pulses supplied by the feedback signal $f_{fb}$ are selectively added to the oscillator input signal $f_{in}$ so as to effectively adjust the normal operating frequency of the oscillator to that frequency which is desired.

In accordance with the instant invention, the oscillator input signal $f_{in}$ is supplied to an input terminal of an input counter 1. Counter 1 divides the frequency of the oscillator input signal $f_{in}$ by a factor of 2. The output signal $f_{in/2}$ from counter 1 and the feedback correction signal $f_{fb}$ are supplied to first and second input terminals of a 2-input OR gate 2. A signal having suitably shaped logic (e.g. binary) levels is supplied from the output terminal of OR gate 2 to an input terminal of a counter stage 4. The frequency of the signal supplied from the output terminal of OR gate 2 to the input terminal of counter stage 4 is the sum of the frequencies of the signal $f_{in/2}$ and the feedback correction signal $f_{fb}$. In a preferred embodiment, counter 4 is a conventional large divider stage which provides an output signal having a frequency equivalent to that of the signal $f_{in/2}$ divided by a factor of 30,720. Thus, the signal at the output terminal of counter 4, has, in the instant embodiment, a frequency of about 0.5 hz.

The output terminal of counter stage 4 is connected to an input terminal of another counter stage 40. Counter stage 40 is comprised of a plurality of well-known toggle flip-flops 6–10. The output terminal of counter 4 is connected to the toggle input terminal of a first flip-flop 6. Each of the plurality of flip-flops 6–10 comprising counter stage 40 operates as a divide-by-2 counter. The sizes of counters 1, 4 and 40 are selected accordingly so that the frequency of an output signal $f_o$ can be chosen as desired. Thus, in the present embodiment, the signal $f_o$ at the output terminal 45 of counter stage 40 has a frequency of 1/60 hz. and a period of 60 seconds.

Each of the plurality of toggle flip-flops 6–10 is electrically connected in a series chain with one another so as to sequentially toggle when the logic level of the signal supplied from the output terminal of counter 4 to the input terminal of counter 40 goes relatively LOW (i.e. false). The logic level of only one of the toggle flip-flops 6–10 goes relatively HI (i.e. true) at any one clock pulse. Because of the divide-by-2 nature of flip-flops 6–10, each flip-flop will toggle at a binary rate with respect to one another (i.e. the clock signal supplied from the output terminal of counter 4 causes flip-flop 6 to toggle at twice the speed of flip-flop 7, four times the speed of flip-flop 8, etc.). Each flip-flop 6–10 has an output terminal thereof connected to a respective input terminal of both a buffer stage 50 and a pulse forming stage 70. The flip-flops 6–10 comprising counter stage 40 provide output pulse trains having suitable logic levels to the respective input terminals of buffer stage 50 and pulse forming stage 70 at the rate at which the flip-flops 6–10 respectively toggle.

In a preferred embodiment, buffer stage 50 is comprised of a plurality of well-known D flip-flops 11–15. Buffer stage 50 is electrically connected between output terminals of counter stage 40 and input terminals of the pulse-forming control stage 70 of the instant feedback arrangement 30. Each of the D flip-flops has a clock input terminal connected at a common junction to receive the oscillator input signal $f_{in}$. Binary information is received at a data terminal of flip-flops 11–15 from a respective output terminal of flip-flops 6–10 when the logic of the oscillator input signal $f_{in}$ goes relatively HI. Information contained in counter stage 40 and each of the flip-flops 6–10 is thereby copied by buffer stage 50 into flip-flops 11–15. Buffer stage 50 is provided to terminate the supply of individual pulses comprising the feedback correction signal $f_{fb}$, the leading edges of which are dependent upon the time required for a signal to be conducted through large counter stage 4. Buffer stage 50 functions, therefore, to separate and prevent overlapping of the pulses forming the oscillator input signal $f_{in}$ and the feedback correction signal $f_{fb}$.

Each D flip-flop 11–15 comprising buffer stage 50 has an output terminal thereof connected to a respective input terminal of pulse-forming control stage 70. Pulse forming control stage 70, in a preferred embodiment, is comprised of a plurality of AND gates 16–20 and a 5-input OR gate 26. It is to be understood, however, that the logic comprising pulse forming stage 70 is for examplary purposes only. Any other suitable logic implementation or transmission gate arrangement may be substituted therefor. Each AND gate 16–20 comprising logic control stage 70 has three input terminals thereof. First input terminals of AND gates 16–20 are connected to the respective output terminals of D flip-flops 11–15 comprising buffer stage 50. Second input terminals of AND gates 16–20 are connected to the respective output terminals of toggle flip-flops 6–10 comprising counter stage 40. Third input terminals of AND gates 16–20 are connected to the respective output terminals of the devices comprising programmable memory stage 60. The output terminal of each of the AND gates 16–20 is connected to an input terminal of OR gate 26. The output terminal of OR gate 26 is connected via feedback path 28 to one input terminal of OR gate 2.

As will be understood by those skilled in the art, OR gate 2 may be deleted and a 6-input OR gate 27 may replace 5-input OR gate 26. The output terminal of input counter 1 is thereupon connected to one input terminal of OR gate 27. The output terminal of OR gate 27 is connected via feedback path $f_{fb}$ to the input terminal of large counter 4, as is illustrated in the embodiment of FIG. 2a.

The logic comprising pulse forming control stage 70 is selectively enabled by programmable memory stage 60. Programmable memory stage 60 is comprised of electrical memory elements, such as conventional CMOS storage flip-flops 21–25. Flip-flops 21–25 are adapted to be selectively forced into a desired binary logic level by momentarily driving them by a suitable voltage supply (e.g. to a binary 1 logic level) or to ground (e.g. to a binary 0 logic level) as will be described in greater detail in FIG. 4. Each flip-flop 21–25 of programmable memory stage 60 will remain at its binary logic level until power is removed from the chip. It is to be understood, however, that other suitable means may be substituted for the storage flip-flops 21–25 which comprise memory stage 60. For example, the third input terminals of AND gates 16–20 may be wire bonded directly to reference potential source means representative of the appropriate logic level signals.

In operation, as earlier disclosed, the oscillator input signal $f_{in}$ is propagated with a frequency less than that ultimately desired. Monitoring means (not shown) are provided to test the frequency of the input oscillator signal $f_{in}$ and to determine how many correction pulses are needed to achieve the desired output frequency. The number of correction pulses to be supplied to the input terminals of AND gates 16–20 comprising pulse forming control stage 70 is a function of the frequency of the input oscillator signal $f_{in}$. Because of the divide-by-2 nature of flip-fops 6–10, the average number of pulses forming the individual pulse-trains of the instant invention which comprise the feedback correction signal $f_{fb}$ is supplied to respective AND gates 16–20 from flip-flops 6–10 in a convenient binary weighted sequence. However, the sequence need not be binary weighted.

When the required number of correction pulses is determined, the (binary) weighted numbers are selected which, when added together, most closely equal the required number of correction pulses. Each of the storage flip-flops 21–25 are initially forced into a LOW logic level. The storage flip-flops 21–25 corresponding to the selected binary numbers (depending upon the respective rate at which flip-flops 6–10 toggle) are forced into a relatively HI logic level. As is well known in the art, in order to enable any of the AND gates 16–20 comprising pulse forming stage 70, a relatively HI logic level signal (i.e. a voltage representative of a binary 1) must be applied to every input terminal thereof. When any one input terminal of AND gates 16–20 receives a logic level signal that is relatively LOW (i.e. a voltage representative of a binary 0), that gate becomes disabled. The output terminals of storage flip-flops 21–25 are connected to respective input terminals of AND gates 16–20. The unselected storage flip-flops 21–25 which remain in a relatively LOW logic level disable those AND gates 16–20 which are respectively connected thereto to thereby clamp the output signals of those AND gates 16–20 to a binary 0 logic level. By forcing the selected ones of the flip-flops 21–25 into a binary 1 logic level, suitable combinations of any desired number of correction pulses within the range of selection can be supplied from flip-flops 6–10 to the input terminals of those AND gates 16–20 respectively connected thereto.

During the interval of time in which the binary state of the toggle flip-flops 6–10 change to relatively HI logic levels, but before D flip-flops 11–15 copy the information supplied thereto, the logic level of the output signals of flip-flops 11–15 is relatively HI, if the binary state of the respectively connected flip-flops 6–10 had been relatively LOW during the previous clock cycle. The output signals of flip-flops 11–15 are supplied to respective first input terminals of AND gates 16–20. Toggle flip-flops 6–10 toggle at different rates relative to one another and supply correction pulse trains comprised of weighted numbers of pulses to respective second input terminals of AND gates 16–20. Thus, any of the AND gates 16–20 are enabled, depending upon which of the storage flip-flops 21–25 are programmed to selectively supply relatively HI logic level signals to respective third input terminals of AND gates 16–20.

At the time that flip-flops 11–15 copy the binary information supplied from the output terminals of flip-flops 6–10, the logic level of the output signals from flip-flops 11–15 changes binary state to a relatively LOW logic level. As a result thereof, AND gates 16–20 are disabled. Consequently, the signals at the output terminals of AND gates 16–20 are clamped relatively LOW. This terminates the propagation of the pulses comprising the feedback correction signal. It will be recognized that the width of the individual pulses comprising the feedback correction signal $f_{fb}$ is determined by the time required for flip-flops 6–10 to undergo a change in binary state and for the flip-flops 11–15 to copy the binary information supplied thereto from the output terminals of flip-flops 6–10.

FIG. 3 shows the waveforms $f_{16-20}$ of the correction pulse trains, through one half of a correction cycle, at the respective output terminals of AND gates 16–20, in the event that AND gates 16–20 are all enabled. It is to be understood, as already disclosed, that by maintaining any of the flip-flops 21–25 in a relatively LOW logic level, any of the AND gates 16–20 respectively connected thereto is disabled. The waveform of the output signal from the corresponding AND gates 16–20 is otherwise clamped relatively LOW.

The output terminals of AND gates 16–20 are connected to respective input terminals of 5-input OR gate 26, as previously disclosed. The correction pulses supplied from AND gates 16–20 are logically gated by OR gate 26 and combined to form the resultant feedback correction signal $f_{fb}$, an example of which is shown in FIG. 3. It is to be noted that because of the respective rates at which flip-flops 11–15 toggle, each of the pulses comprising the waveforms of the signals $f_{16-20}$ that are gated by OR gate 26 do not overlap, but are propagated separately with respect to one another. The feedback correction signal $f_{fb}$ is supplied via feedback path 28 to an input terminal of OR gate 2. The feedback correction signal $f_{fb}$ is gated and added together with input signal $f_{in/2}$ by OR gate 2 so as to correct the source frequency and to subsequently provide an output signal $f_o$, the average frequency of which is accurately adjusted as desired.

Figure 4:
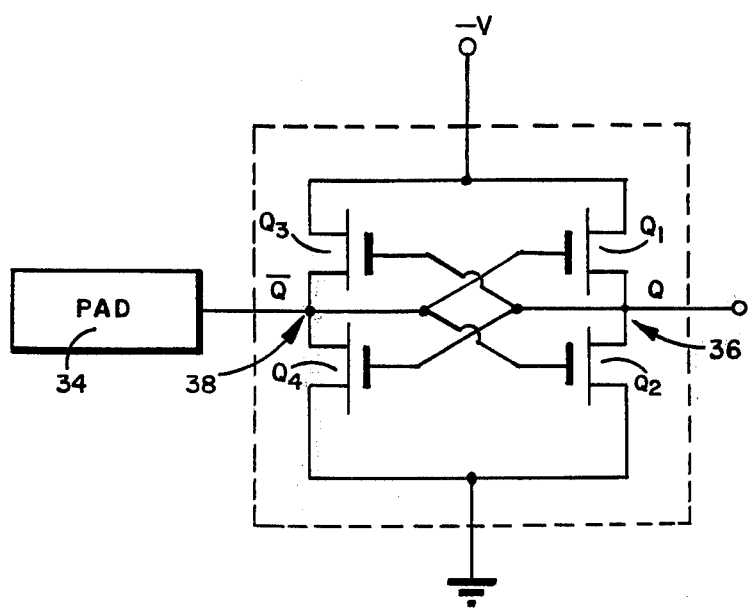
FIG. 4 shows one example of a memory element which comprises the programmable memory stage of the instant frequency correction arrangement.

Referring to FIG. 4, a conventional circuit is shown for implementing storage flip-flops 21–25 comprising programmable memory stage 60 of FIG. 2. It is to be understood that the circuit illustrated is for exemplary purposes only. Other well known memory elements may be utilized, as well. The instant memory element, the operation of which is well known, is comprised of a pair of cross-coupled inverter stages 38 and 40. Each inverter stage includes a first p-channel field effect transistor $Q_1$ and $Q_3$ and a second n-channel field effect transistor $Q_2$ and $Q_4$, respectively.

Typically, the oscillator (not shown), counter stages 1, 4 and 40, and the programmable memory stage 60 are all contained on a single LSI chip. Memory stage 60 is programmed off the chip by momentarily probing (e.g. by means of a probe tip or wire) a reference potential representative of a binary 1 or 0 onto an interface pad 34 which, if suitably sized, could be disposed on the LSI chip. More particularly, by connecting a supply voltage source means $-V$ or a reference potential source means, such as ground, to a pad 34, any of the flip-flops 21–25 can be selectively forced into the desired logic state. Power is consumed only during the moment of transition of the flip-flop. If the chip power is temporarily removed, the memory stage must be reprogrammed.

The frequency of the output signal $f_o$ (best shown in FIG. 2) will exhibit some instantaneous error. However, by virtue of the instant feedback correction arrangement 30, over the period of one correction cycle, the error will average out to a small number. Adequate time must be provided between the falling and rising edges of the input clock signal $f_{in/2}$ and the rising and falling edges of the feedback correction signal $f_{fb}$ so as to permit the large counter stage 4 to respond to each binary 1 and 0 logic level when the clock signal $f_{in/2}$ and the feedback control signal $f_{fb}$ are gated together by OR gate 2.

It will be apparent that while a preferred embodiment of the invention has been shown and described, various modifications and changes may be made without departing from the true spirit and scope of the invention. For example, although flip-flops 6–10 are described as toggle flip-flops and flip-flops 11–15 are described as D-flip-flops, it is to be understood that any other suitable flip-flop (e.g. such as, for example, R-S, J-K, or the like) may be substituted therefor.

Having thus set forth a preferred embodiment of the instant invention, what is claimed is:

1. In combination:
   first and second signal gating means having input and output terminal means, said first signal gating means output terminal means connected to a counter means,
   said counter means providing a plurality of output pulse trains, each of said pulse trains applied to respective first terminals comprising said second signal gating means input terminal means,
   clock terminal means for supplying a sequence of clock pulses, said clock terminal means connected to said first signal gating means input terminal means and to a buffer means, said buffer means connected between said counter means and second terminals comprising said second signal gating means input terminal means, means to selectively connect a source of enabling signals to third terminals comprising said second signal gating means input terminal means to control the gating of output signals from said buffer means with selected ones of said counter means pulse trains so as to thereby provide a correction signal, output signals from said buffer means controlling the pulse duration of said gated correction signal with respect to the pulse duration of said sequence of clock pulses so that there is no pulse overlap therebetween, and feedback means connected between said second signal gating means output terminal means and said first signal gating means input terminal means so that said correction signal is fed back and gated with said sequence of clock pulses.

2. The combination recited in claim 1, wherein said counter means is comprised of a plurality of frequency divider stages, each of said stages connected in a series circuit with one another so as to successively divide the frequency of an input signal applied to said counter means to thereby provide a plurality of output pulse trains having respective frequencies which are multiples of one another.

3. The combination recited in claim 2, wherein each of said plurality of frequency divider stages of said series circuit is a bistable device, each of said bistable devices having an output terminal respectively connected to said first terminals comprising said second signal gating means input terminal means.

4. The combination recited in claim 3, wherein each of said bistable devices is a flip-flop, said counter means counting in a binary sequence.

5. The combination recited in claim 1, including signal delay means connected between said first signal gating means output terminal means and said counter means.

6. The combination recited in claim 5, wherein said signal delay means is another counter means.

7. The combination recited in claim 1, wherein said means to selectively connect the source of enabling signals comprises a plurality of bistable devices, each of said bistable devices having an input terminal connected to said source of enabling signals and an output terminal respectively connected to said third terminals comprising said second signal gating means input terminal means.

8. The combination recited in claim 1, said buffer means comprising a plurality of bistable devices, each of said buffer means bistable devices having input terminal means connected to said clock terminal means to receive said supply of clock pulses and to said counter means to receive and copy the counter means output pulse trains, and output terminal means respectively connected to said second terminals comprising said second signal gating means input terminal means.

9. A circuit to correct the frequency of an input clock signal to a desired frequency including:

input terminal means to receive said clock signal, feedback means to provide a frequency correction signal to be added to said clock signal in order to increase the frequency thereof, said feedback means comprising.

signal gating means having input and output terminal means thereof, said clock input terminal means connected to said signal gating means input terminal means, counter means connected between said signal gating means output and input terminal means, said counter means receiving an output signal from said signal gating means and successively dividing said output signal to provide a plurality of signals having frequencies which are multiples of one another, buffer means having output terminal means connected to said signal gating means and input terminal means connected to said input clock terminal means to receive said clock signal and to said counter means to copy each of said plurality of signals therefrom in order to control the pulse width of the frequency correction signal with respect to that of said clock signal and thereby prevent the overlapping of pulses comprising said correction signal with those of said clock signal, and gate control means selectively connected between a source of enabling signals and said signal gating means input terminal means in order that said signal gating means be responsive to selected ones of said plurality of signals from said counter means.

10. The frequency correction circuit recited in claim 9, wherein said signal gating means includes a plurality of logic gates, each of said logic gates having a plurality of input terminals and an output terminal thereof.

11. The frequency correction circuit recited in claim 10, wherein said counter means is comprised of a plurality of series-connected signal divider stages to successively divide the frequency of said clock signal into said plurality of signals, an output terminal of each of said divider stages connected to a respective input terminal of said buffer means and to a respective first input terminal of each of said signal gating means logic gates.

12. The frequency correction circuit recited in claim 11, wherein said gate control means is comprised of a plurality of switching means, a terminal of each of switching means selectively connected to a respective second input terminal of each of said signal gating means logic gates to thereby render said logic gates responsive to selected ones of said plurality of signals from said counter means.

13. The frequency correction circuit recited in claim 12, wherein said buffer means is comprised of a plurality of bistable devices, each of said devices having an input terminal connected to a respective output terminal of said counter means divider stages, each of said devices having an output terminal connected to a respective third input terminal of each of said signal gating means logic gates.

* * * * *